United States Patent [19]

Bartlett et al.

[11] 4,412,340

[45] Oct. 25, 1983

[54] ONE-BIT AUTOCORRELATION ENVELOPE DETECTOR

[75] Inventors: Marion C. Bartlett; Raymond C. Johnson, both of Gainesville, Fla.

[73] Assignee: The United States of America as represented by the Secretary of the Army, Washington, D.C.

[21] Appl. No.: 334,626

[22] Filed: Dec. 28, 1981

[51] Int. Cl.$^3$ .................... H03D 3/02

[52] U.S. Cl. .................... 375/96; 375/102; 364/728

[58] Field of Search .................... 375/39, 96, 99, 102; 364/728; 329/104, 120, 118; 370/19, 20; 343/100 CL

[56] References Cited

U.S. PATENT DOCUMENTS 3.921,075 11/1975 Denny .................... 375/99

3,993,956 11/1976 Gilmore et al. .................... 375/96

4,057,759 11/1977 Genova et al. .................... 375/96

4,088,960 5/1978 Osborne .................... 375/96

4,100,378 7/1978 Claasen et al. .................... 364/728

4,164,036 8/1979 Wax .................... 364/728

*Primary Examiner*—Robert L. Griffin

*Assistant Examiner*—Stephen Chin

*Attorney, Agent, or Firm*—Robert P. Gibson; Anthony T. Lane; Saul Elbaum

[57] ABSTRACT

An apparatus for automatically detecting the existence of an unknown narrow-band signal in the presence of wide-band noise-like interference. The apparatus performs a one-bit autocorrelation at a delay time such that wide-band signals are decorrelated while narrow-band signals remain correlated. Additionally, the autocorrelation is separated into quadrature components which are re-combined to give an estimate of the envelope of the autocorrelation of the input signal.

7 Claims, 8 Drawing Figures

FIG.1
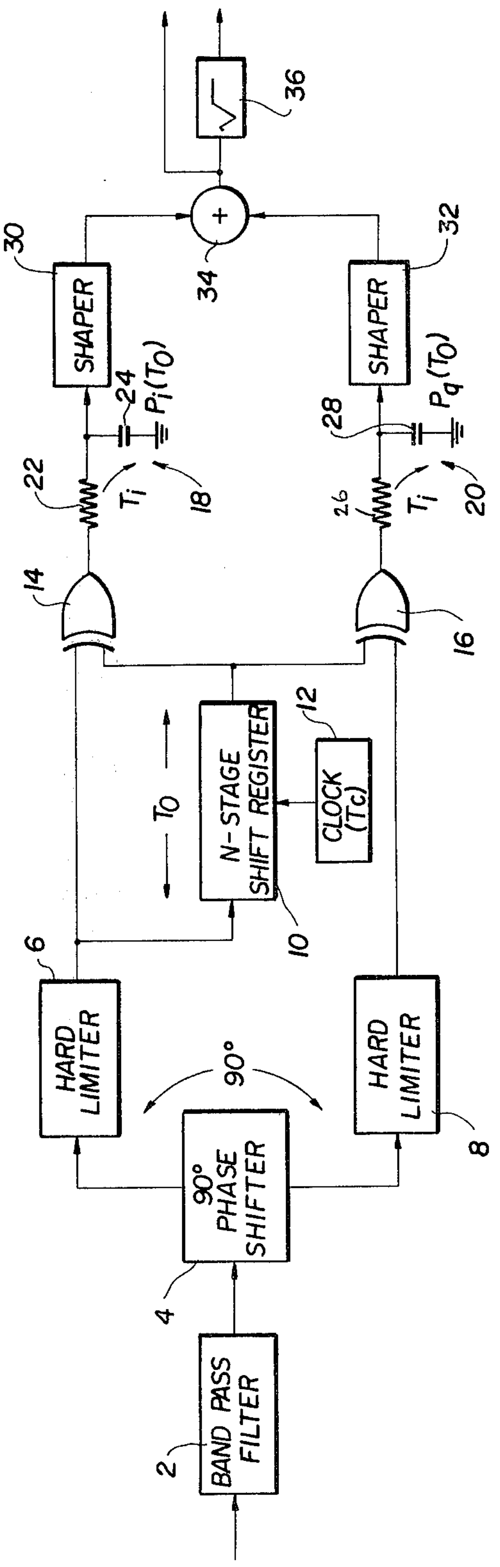
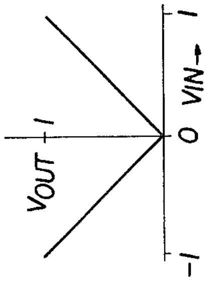
VOUT = |VIN|
FIG.2
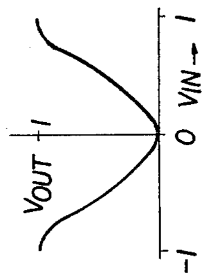
$V_{OUT} = \sin^2(\frac{\pi}{2} V_{IN})$
FIG.3
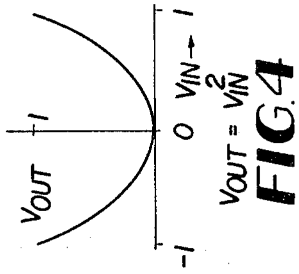
$V_{OUT} = V_{IN}^2$
FIG.4

ONE-BIT AUTOCORRELATION ENVELOPE DETECTOR

RIGHTS OF THE GOVERNMENT

The invention described herein may be manufactured, used, and licensed by or for the U.S. Government for governmental purposes without the payment to me of any royalty thereon.

BACKGROUND OF THE INVENTION

The present invention is directed to an apparatus for automatically detecting the existence of a narrow band signal in the presence of wide-band noise-like interference, and finds particular use in weapons systems for recognizing a target in a clutter environment.

Autocorrelation detectors and cross-correlation detectors have been in existence for years, and most of these detectors produce an output which is proportional to the analog product of the two signals to be correlated. It is known that by first hard-limiting the two signals, a polarity coincident, or one-bit correlation, can be performed. This has the advantage of producing a normalized correlation where the output is a function of the signal-to-noise ratio, and such a correlator wherein the correlation is disclosed as being performed at zero time delay is described in the article, "Polarity Coincident Correlation Detection of a Weak Noise Source", by Helge Ekre, IEEE Trans on Information Theory, p.p. 18–23; January 1963.

SUMMARY OF THE INVENTION

In accordance with the present invention, a one-bit, autocorrelation is performed at a delay time such that wide-band signals are decorrelated while narrow-band or desired signals remain correlated. In addition, the autocorrelation is separated into quadrature components and recombined to give an estimate of the envelope of the autocorrelation of the input signal. The advantage of obtaining the envelope can be demonstrated by considering a sinusoidal signal, of unknown radian frequency $\omega$, whose normalized autocorrelation at a fixed delay $\tau 0$ is given by cos $\omega\tau_0$. This cannot be detected automatically by a correlation detector because, depending on $\omega$, any value between $\pm 1$ could be produced by cos $\omega\tau_0$. The invention, however, provides an output which is the envelope of the complex autocorrelation exp $(j\omega\tau_0)$, which is $+1$ for any $\omega$. This is easily detected by a threshold device where the threshold for detection is set above the system noise, but less than $+1$.

It is thus an object of the present invention to provide an apparatus for detecting the existence of a narrow-band signal in the presence of wideband noise-like interference.

BRIEF DESCRIPTION OF THE DRAWINGS

The invention will be better understood by referring to the accompanying drawings in which:

FIG. 1 is a block diagram of an embodiment of the present invention.

FIGS. 2, 3 and 4 are graphical representations of exemplary transfer characteristics for shapers 30 and 32 of FIG. 1.

DESCRIPTION OF THE PREFERRED EMBODIMENTS

Figure 5:
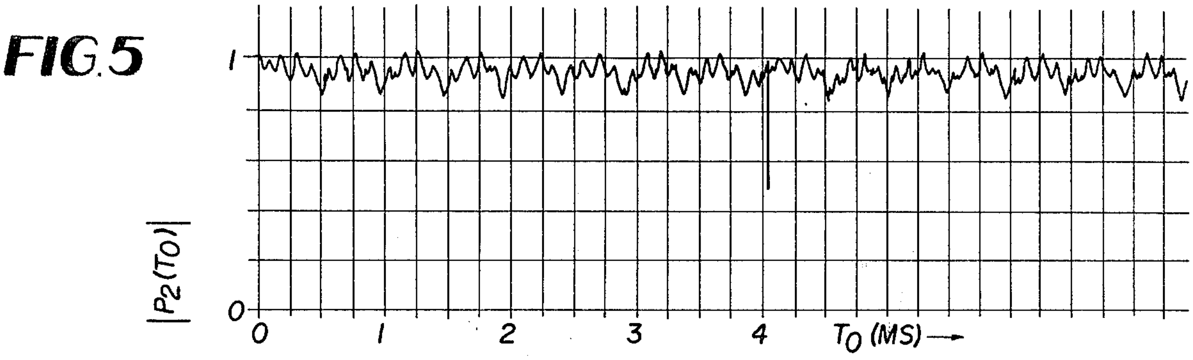
FIG. 5 is a graphical representation of an autocorrelation envelope provided by the invention using shapers having a characteristic as depicted in FIG. 3, for $S/N = +6$ dB.

A block diagram of an embodiment of the invention is shown in FIG. 1, and is seen to include bandpass filter 2, and 90° phase shifter 4 which produces two output voltages which are 90° out of phase with each other and are fed through an in-phase and quadrature channel. The in-phase channel is comprised of hard limiter 6, exclusive-OR circuit 14, integrator 18, and shaper 30 while the quadrature channel is comprised of hard limiter 8 exclusive-OR circuit 16, integrator 20, and shaper 32. Additionally, N-stage shift register 10 fed by clock 12 is provided for producing a delay $\tau_0$, which is the desired delay at which the correlation in both channels is to be performed. Adder 34 for adding the outputs of shapers 30 and 32 is also provided, and in certain embodiments square root taking circuit 36 is also present.

In the operation of the apparatus, a signal voltage S and noise-like interference N enter the circuit shown in FIG. 1 at the input of the bandpass filter, the signal bandwidth being less than that of the noise. Bandpass filter 2 restricts the band of measurement to the desired center frequency range of the signal and restricts the noise to the filter bandwidth. 90° phase splitter 4 is arranged to produce two output voltages which are 90° out of phase with each other over the full bandwidth of bandpass filter 2.

The two outputs from phase shifter 4 are fed respectively to hard limiters 6 and 8 which act as one-bit analog to digital convertors. The one-bit digitized output of hard limiter 6 is applied both to exclusive-OR circuit 14 which acts as the correlator and to the input of N-stage shift register 10, the output of which is also applied to exclusive-OR gate 14. The shift register is clocked by clock 12 at a frequency $(1/T_c)$ which is at least 10 times the upper frequency of bandpass filter 2, in order to reduce aliasing. The net delay is $\tau_0 = NT_c$, where $\tau_0$ is the desired delay at which the correlation is to be performed.

The output of exclusive-OR circuit 14 is the one-bit product of the two input voltages thereto. When averaged in an integrator circuit such as 18, illustratively depicted as being comprised of resistor 22 and capacitor 24, having an integration time $T_i$ which is much greater than the reciprocal of the bandwidth of bandpass filter 2, the integrator circuit is the normalized autocorrelation of the voltage outputted from hard limiter 6 as measured at the delay $\tau_0$. This voltage is called $\rho_i(\tau_0)$ to represent the in-phase component of the normalized autocorrelation of the voltage present at the output of bandpass filter 2.

The voltage outputted from hard limiter 8 is 90° out of phase with the voltage outputted from hard limiter 6. The one-bit product of the voltage outputted by hard limiter 8 and that outputted by shift register 10, as provided by exclusive-OR gate 16, when averaged by integrator circuit 20 which is identical to circuit 18, produces an output voltage which represents the quadrature component $\rho_q(\tau_0)$ of the normalized autocorrelation of the voltage present at the output of bandpass filter 2. Obtaining both the in-phase and quadrature components of the autocorrelation function is a novel feature of the present invention, and these components can then be combined in several ways to produce an estimate of the envelope of the autocorrelation of the voltage present at the output of bandpass filter 2.

Before being combined, the two signals are shaped by shapers 30 and 32 respectively, and the simplest method of estimating the envelope of $\rho_2(\tau_0)$ is to arrange the transfer characteristic of shapers 30 and 32 to be of the absolute value-taking type shown in FIG. 2. Simple addition of the output voltages of shapers 30 and 32 then produce the estimate $$V=|\rho_i(\tau_0)|+|\rho_q(\tau_0)|\approx|\rho_2(\tau_0)|$$

By using shaper characteristics such as shown in FIGS. 3, or 4, summing in summer 34, and taking the square root of the result in square root taking circuit 36, the following estimates can be obtained:

For the shaper shown in FIG. 3, $$V=\sqrt{\sin^2\left[\frac{\pi}{2}\rho_i(\tau_0)\right]+\sin^2\left[\frac{\pi}{2}\rho_q(\tau_0)\right]}\approx|\rho_2(\tau_0)|$$

For the shaper shown in FIG. 4, $$V=\sqrt{[\rho_i(\tau_0)]^2+[\rho_q(\tau_0)]^2}\approx|\rho_2(\tau_0)|;$$

where, for Gaussian signal and noise, $$\rho_i(\tau_0)=\frac{2}{\pi}\sin^{-1}[\text{Real}\,[\rho_2(\tau_0)]]$$

$$\rho_q(\tau_0)=\frac{2}{\pi}\sin^{-1}[\text{Imag}\,[\rho_2(\tau_0)]]$$

Figure 6:
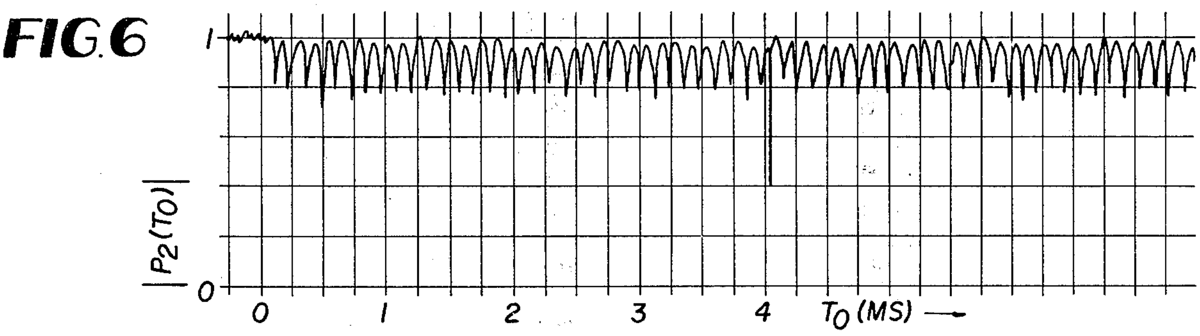
FIG. 6 is a graphical representation of an autocorrelation envelope provided by the invention using shapers having a characteristic as depicted in FIG. 2, for $S/N = +6$ dB.
Figure 7:
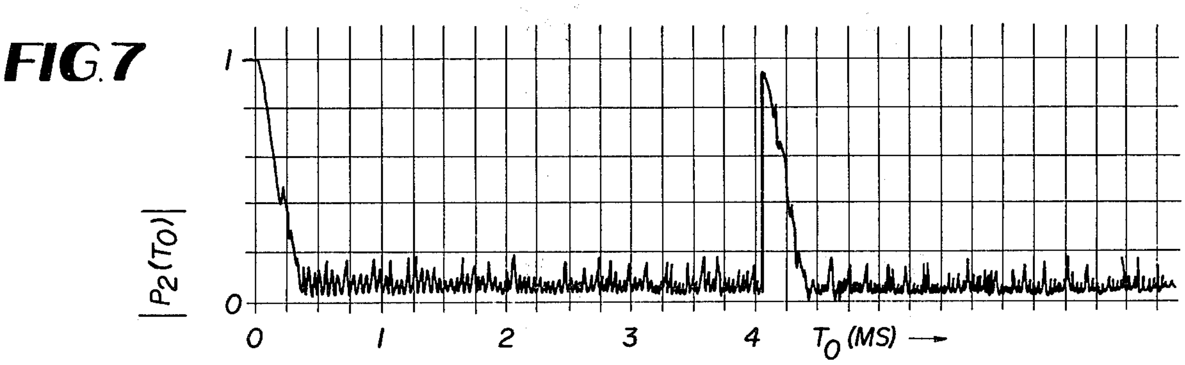
FIG. 7 is an autocorrelation envelope provided by the invention using shapers having a characteristic as depicted in FIG. 3, for $S/N = -\infty$ dB.
Figure 8:
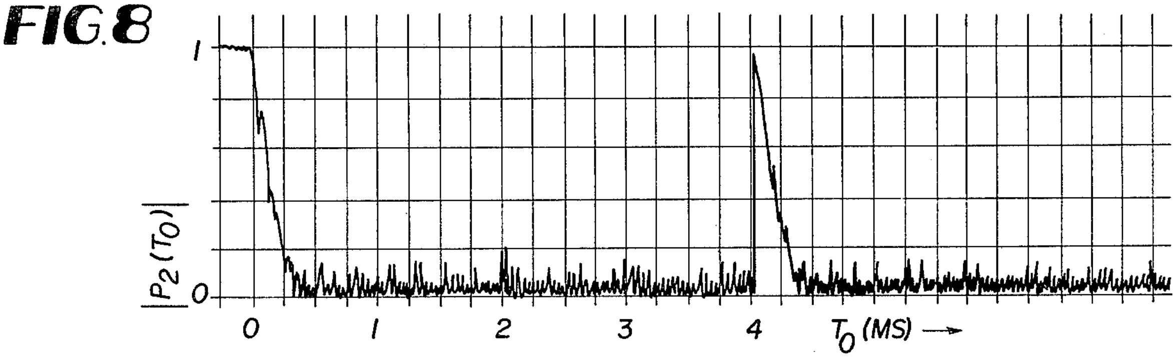
FIG. 8 is a graphical representation of an autocorrelation envelope provided by the invention using shapers having a characteristic as depicted in FIG. 2, for $S/N = -\infty$ dB.

Actual measured results of using the one-bit autocorrelation envelope detector of the invention are shown in FIGS. 5 and 6 for a signal to noise ratio at the output of bandpass filter 2 in FIG. 1 of +6 dB, and in FIGS. 7 and 8 for a signal-to-noise ratio of $-\infty$ dB. In FIGS. 5 and 6, a 2000 Hz signal was used in 200–4000 Hz noise while in FIGS. 7 and 8, 200–4000 Hz noise was used. FIGS. 5 and 7 depict the results using the shaper characteristic illustrated in FIG. 3 while FIGS. 6 and 8 depict the results using the shaper characteristic depicted in FIG. 2. In all of these figures, $\tau_0$ was varied by digitally moving the tap of a shift register from $\tau_0=0$ to $\tau_0=4$ milliseconds so that an autocorrelation envelope could be recorded. These recordings show the utility of the apparatus of the invention in being able to automatically detect the presence of a narrowband signal mixed with noise. Thus, for a millisecond delay, the $-\infty$ dB correlation envelope is decorrelated to less than 0.2, while the 6 dB mixture of sine wave and noise remains more than 0.8 correlated. The autocorrelation envelope will decorrelate in about one reciprocal bandwidth so that if $\tau_0$ is selected such that $1/B_N<\tau_0 1/B_S$, where $B_N$ and $B_S$ are noise and signal bandwidths, the signal will always produce more output than the noise.

There thus has been disclosed an autocorrelation detector in accordance with my invention. I wish it to be understood that I do not desire to be limited to the exact details of construction shown and described, for obvious modifications can be made by a person skilled in the art.

We claim:

1. Correlation apparatus for detecting an unknown, narrow-band signal in the presence of wide-band noise-like interference, comprising, bandpass filter means for accepting said signal and noise and providing a frequency limited output signal, means for receiving said output signal and for providing therefrom first and second outputs which are phase-shifted 90° for each other, means for hard-limiting said first and second outputs to provide first and second hard limited digital signals, means for autocorrelating said first and second hard-limited signals at a selected delay to provide first and second autocorrelation signals, means for integrating said first and second autocorrelation signals to provide first and second integrated signals, and means for processing said first and second integrated signals for providing an estimate of the envelope of the autocorrelation of said frequency limited signal.

2. The apparatus of claim 1, wherein said means for processing includes, means for shaping said first and second integrated signals, for providing first and second shaped signals, and means for combining said first and second shaped signals.

3. The apparatus of claim 2, wherein said means for shaping comprises means for taking the absolute values of said integrated signals and wherein said means for combining comprises means for adding.

4. The apparatus of claim 2, wherein said means for shaping comprises transfer means having the following output-input transfer characteristic $$V_o=\sin^2\left(\frac{\pi}{2}V_{in}\right)$$

where $V_o$=output voltage, and $V_{in}$=input voltage.

5. The apparatus of claim 2, wherein said means for shaping comprises transfer means having the following output-input transfer characteristic $$V_o=V_{in}^2$$

where $V_o$=output voltage, and $V_{in}$=input voltage.

6. The apparatus of claims 4 or 5, wherein said means for combining comprises means for adding to provide an additive signal, and wherein said means for processing further includes means for taking the square root of said additive signal.

7. The apparatus of claim 2, wherein said means for correlating said first and second hard-limited signals at a selected delay includes shift register means for introducing said delay.

* * * * *